United States Patent
Kodaira et al.

(10) Patent No.: US 12,422,453 B2
(45) Date of Patent: Sep. 23, 2025

(54) STANDARD SAMPLE AND MANUFACTURING METHOD THEREOF

(71) Applicant: NTT ADVANCED TECHNOLOGY CORPORATION, Tokyo (JP)

(72) Inventors: Akira Kodaira, Tokyo (JP); Takashi Maruyama, Tokyo (JP); Satoshi Oku, Tokyo (JP)

(73) Assignee: NTT ADVANCED TECHNOLOGY CORPORATION, Tokyo (JP)

( * ) Notice: Subject to any disclaimer, the term of this patent is extended or adjusted under 35 U.S.C. 154(b) by 289 days.

(21) Appl. No.: 17/998,324

(22) PCT Filed: May 14, 2020

(86) PCT No.: PCT/JP2020/019260
§ 371 (c)(1),
(2) Date: Nov. 9, 2022

(87) PCT Pub. No.: WO2021/229755
PCT Pub. Date: Nov. 18, 2021

(65) Prior Publication Data
US 2023/0228792 A1 Jul. 20, 2023

(51) Int. Cl.
*G01Q 40/02* (2010.01)
(52) U.S. Cl.
CPC .................................. *G01Q 40/02* (2013.01)
(58) Field of Classification Search
CPC .................................................... G01Q 40/02
See application file for complete search history.

(56) References Cited

U.S. PATENT DOCUMENTS

| 5,578,745 A | 11/1996 | Bayer et al. |
| 5,741,614 A | 4/1998 | McCoy et al. |

(Continued)

FOREIGN PATENT DOCUMENTS

| CN | 103890921 A | 6/2014 |
| JP | 07-176585 A | 7/1995 |

(Continued)

OTHER PUBLICATIONS

CN Office Action, including Search Report received for Chinese Patent Application No. 202080100681.2, mailed on Sep. 13, 2024, 15 pages (7 pages of English Translation and 8 pages of Original Document).

(Continued)

*Primary Examiner* — Nicole M Ippolito
(74) *Attorney, Agent, or Firm* — WOMBLE BOND DICKINSON (US) LLP

(57) ABSTRACT

A substrate (101) is etched by etching processing with crystal anisotropy, thereby forming a recess (104) from the main surface of the substrate (101) to the inside of the substrate (101). A side surface (105) is almost a (111) plane, and the etching hardly progresses. As a result, a cross section of the recess (104) perpendicular to the longitudinal direction has a rectangular shape. Since an opening (103) of a mask pattern (102) has a rectangular shape in a planar view, the opening of the recess (104) has a rectangular shape in a planar view, and the recess (104) is formed into, for example, a rectangular parallelepiped shape. The recess (104) includes a side surface (105) that forms one plane perpendicular to the main surface of the substrate (101). The side surface (105) is a facet surface and is a tilting surface tilted from the (111) plane.

12 Claims, 2 Drawing Sheets

(56) References Cited

U.S. PATENT DOCUMENTS

| | | | |
|---|---|---|---|
| 6,150,275 | A | 11/2000 | Cho et al. |
| 6,869,480 | B1 | 3/2005 | Abel et al. |
| 2004/0018701 | A1 | 1/2004 | Ueda |
| 2005/0219548 | A1 | 10/2005 | Muroya |
| 2006/0148154 | A1 | 7/2006 | Shin et al. |
| 2006/0237644 | A1 | 10/2006 | Nakayama |
| 2008/0108184 | A1 | 5/2008 | De et al. |
| 2013/0130482 | A1 | 5/2013 | Masuda et al. |
| 2019/0120777 | A1 | 4/2019 | Fukuda |
| 2020/0220014 | A1* | 7/2020 | Jambunathan ....... H10D 30/014 |
| 2021/0082662 | A1* | 3/2021 | Iida ....................... H01J 37/263 |

FOREIGN PATENT DOCUMENTS

| | | |
|---|---|---|
| JP | 2004-251682 A | 9/2004 |
| JP | 2006-220517 A | 8/2006 |
| JP | 2007-078679 A | 3/2007 |
| JP | 2008-083069 A | 4/2008 |
| JP | 2008-224258 A | 9/2008 |
| JP | 2010-271228 A | 12/2010 |
| JP | 2019-078578 A | 5/2019 |
| KR | 10-1999-0079113 A | 11/1999 |
| KR | 2003-0095252 A | 12/2003 |
| KR | 10-2006-0080303 A | 7/2006 |
| KR | 10-2006-0130572 A | 12/2006 |
| WO | 2010/052840 A1 | 5/2010 |
| WO | 2013/069067 A1 | 5/2013 |
| WO | 2017/203406 A1 | 11/2017 |

OTHER PUBLICATIONS

Decision to grant a European patent received for European Application No. 20935239.2, mailed on Feb. 13, 2025, 3 pages.
Extended European Search Report and Search Opinion received for European Application No. 20935239.2 , mailed on Dec. 22, 2023, 5 pages.
Intention to Grant received for European Application No. 20935239.2, mailed on Oct. 4, 2024, 6 pages.
International Preliminary Report on Patentability received for PCT Patent Application No. PCT/JP2020/019260, mailed on Nov. 24, 2022, 9 pages (6 pages of English Translation and 3 pages of Original Document).
International Search Report and Written Opinion received for PCT Patent Application No. PCT/JP2020/019260, mailed on Aug. 4, 2020, 13 pages (6 pages of English Translation and 7 pages of Original Document).
Request for the Submission of an Opinion received for Korean Patent Application No. 10-2022-7039628, mailed on Nov. 7, 2024, 11 pages (6 pages of English Translation and 5 pages of Original Document).
Request for the Submission of an Opinion received for Korean Patent Application No. 10-2022-7039628, mailed on Jul. 8, 2025, 11 pages (6 pages of English Translation and 5 pages of Original Document).

* cited by examiner

STANDARD SAMPLE AND MANUFACTURING METHOD THEREOF

TECHNICAL FIELD

The present invention relates to a standard sample used to evaluate a scanning probe microscope or the like and a manufacturing method thereof.

BACKGROUND ART

Concerning semiconductor micronization, the road map IRDS (International Roadmap for Device and System) formulated in 2017 by IEEE specifies goals of a pattern size in a logic device until 2021, in which a half pitch is 12 nm, and a line edge roughness (LER) is less than 2 nm, and pattern manufacturing methods and inspection methods for the goals have been discussed. Note that the LER represents the unevenness of the edge of a resist pattern used as a mask in a lithography technique.

As an LER evaluation method, measurement using a microscope capable of performing observation in a nanometer size (having a resolution in a nanometer size), such as an atomic force microscope (AFM), can be used. In measurement of this type, to accurately measure roughness using an image output from a measurement device such as a SEM, noise included in an image signal is removed (see Patent literature 1). In this technique, to remove noise included in the image signal, a standard sample whose LER is controlled in advance is used.

Also, in a measurement technique such as AFM, to guarantee a resolution or an error, measurement by a probe in a nanometer size is executed using a standard sample whose minimum structure has a size of 100 nm or less, and the resolution is obtained from obtained image data (see Patent literature 2). In this standard sample, however, although the size is decided, the shape of the pattern edge is indefinite.

On the other hand, as a currently used standard sample, a standard sample prepared by the NIST (the National Institute of Standards and Technology) in U.S.A. is used. This standard sample is a nanowire with a minimum size of 130 nm.

In Japan, the National Institute of Advanced Industrial Science and Technology (AIST) conducts certifications in the length direction using a tungsten-dot array. However, the minimum size of this standard sample is 119 nm, which is not small enough to evaluate presently problematic unevenness on several nm order.

Also, although the AIST conducts certifications for structures of 10 nm or more, no technique is specified yet concerning how to correctly measure a shape whose size is on the order of 1 nm.

RELATED ART LITERATURE

Patent Literature

Patent Literature 1: Japanese Patent Laid-Open No. 2019-078578
Patent Literature 2: Japanese Patent Laid-Open No. 2007-078679

DISCLOSURE OF INVENTION

Problem to be Solved by the Invention

It is considered that the above-described standard sample is manufactured using, for example, semiconductor device manufacturing techniques such as a deposition technique, a lithography technique, and an etching technique. However, in a periodical pattern formed by these manufacturing methods, an LER with a nanometer size is generated in the edge portion of the pattern, and it is difficult to clarify the difference from a defect with a nanometer size. For this reason, it is not sufficient as a standard sample.

The present invention has been made to solve the above-described problem, and has as its object to provide a standard sample capable of evaluating a line edge roughness on the order of 1 nm.

Means of Solution to the Problem

According to the present invention, there is provided a standard sample used to evaluate a microscope capable of performing observation in a nanometer size, including a scanning probe microscope, comprising a substrate made of a crystal with a main surface that is a (110) plane, and a recess formed from the main surface of the substrate to an inside of the substrate, wherein the recess includes a side surface that forms one plane perpendicular to the main surface of the substrate, and the side surface is a facet surface and is a tilting surface tilted from a (111) plane.

According to the present invention, there is also provided a manufacturing method of a standard sample used to evaluate a microscope capable of performing observation in a nanometer size, including a scanning probe microscope, comprising a first step of forming a mask pattern including an opening with a linear portion in a planar view on a substrate made of a crystal with a main surface that is a (110) plane, and a second step of etching the substrate by etching processing with crystal anisotropy using the mask pattern as a mask, thereby forming a recess formed from the main surface of the substrate to an inside of the substrate, wherein the recess includes a side surface that forms one plane perpendicular to the main surface of the substrate, and the side surface is a facet surface and is a tilting surface tilted from a (111) plane.

Effect of the Invention

As described above, according to the present invention, since a recess including a side surface that is a facet surface and is a tilting surface tilted from the (111) plane is formed in a substrate whose main surface is the (110) plane, it is possible to provide a standard sample capable of evaluating a line edge roughness on the order of 1 nm.

BEST MODE FOR CARRYING OUT THE INVENTION

A manufacturing method of a standard sample according to the embodiment of the present invention will now be described with reference to FIGS. 1A to 1E. This manufacturing method is a manufacturing method of a standard sample used to evaluate a microscope capable of performing observation in a nanometer size (having a resolution in a nanometer size), including a scanning probe microscope.

Figure 1A:
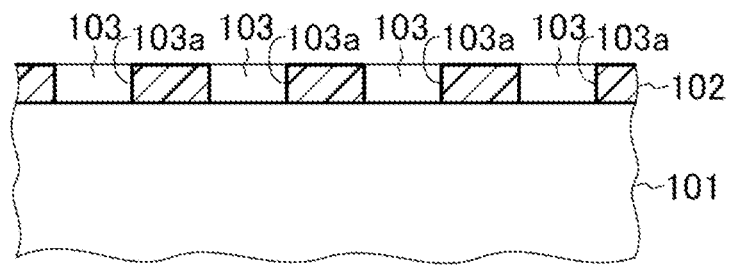
FIG. 1A is a sectional view showing a state of a standard sample in a midway step so as to explain the manufacturing method of the standard sample according to the embodiment of the present invention.
Figure 1B:
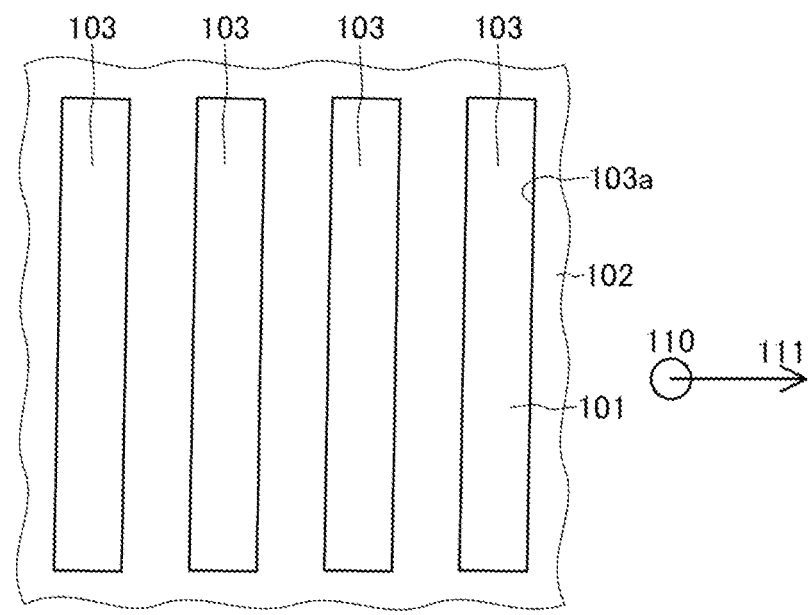
FIG. 1B is a plan view showing a state of the standard sample in a midway step so as to explain the manufacturing method of the standard sample according to the embodiment of the present invention.

First, as shown in FIGS. 1A and 1B, a mask pattern 102 is formed on a substrate 101 that is made of a crystal and includes a main surface that is the (110) plane (first step). The mask pattern 102 includes an opening 103 with a linear portion in a planar view. The substrate 101 is made of, for example, a single crystal of silicon. The substrate 101 can also be made of a crystal of GaAs or InP. The opening 103 has, for example, a rectangular shape in a planar view. For example, the opening 103 is formed such that a side surface 103a of a side in the longitudinal direction of a rectangle in a planar view becomes a surface parallel to the facet surface of the substrate 101 made of single crystal silicon, which is tilted by 1° from the (111) plane. For example, if the longitudinal direction of the above-described rectangle is set to extend in a direction rotated by 1° from the <111> direction, the side surface 103a can be the surface parallel to the facet surface tilted by 1° from the (111) plane.

A plurality of openings 103 are formed. The mask pattern 102 is called a line-and-space pattern in which, for example, the plurality of openings 103 form a space pattern. For example, the line width can be 200 nm, and the space width can be 200 nm. For example, the mask pattern 102 can be formed by a known lithography technique.

Figure 1C:
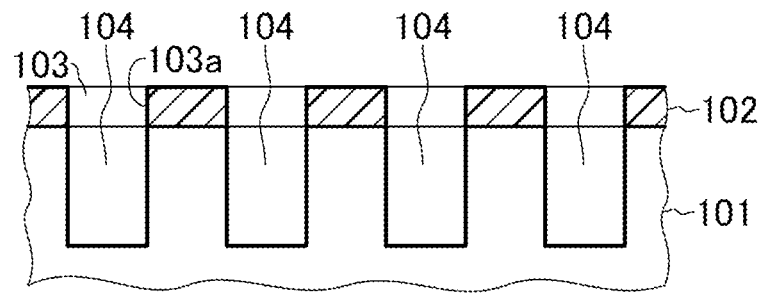
FIG. 1C is a sectional view showing a state of the standard sample in a midway step so as to explain the manufacturing method of the standard sample according to the embodiment of the present invention.

Next, as shown in FIG. 1C, using the mask pattern 102 as a mask, the substrate 101 is etched by etching processing with crystal anisotropy, thereby forming recesses 104 from the main surface of the substrate 101 to the inside of the substrate 101 (second step). For example, for the substrate 101 made of single crystal silicon, etching processing with crystal anisotropy can be performed by wet etching using an alkaline solution as an etchant. As is well known, if single crystal silicon is etched using an alkaline solution, the (111) plane is hardly etched because the etching rate is lower by 1/1000 than on the (100) plane or (110) plane.

Hence, if the substrate is etched by an alkaline solution using the mask pattern 102 as a mask, the (100) plane of the substrate 101, which is exposed to the bottom surface of each opening 103, is etched, and the etching progresses in the thickness direction of the substrate 101. On the other hand, side surfaces 105 of the recesses 104, which are formed along with the progress of the etching and are parallel to the side surfaces 103a of the openings 103, are almost (111) planes, and the etching hardly progresses. As a result, a cross section of the recess 104 perpendicular to the longitudinal direction has a rectangular shape. Note that since the opening 103 of the mask pattern 102 has a rectangular shape in a planar view, the opening of the recess 104 has a rectangular shape in a planar view, and the recess 104 is formed into, for example, a rectangular parallelepiped shape.

Figure 1D:
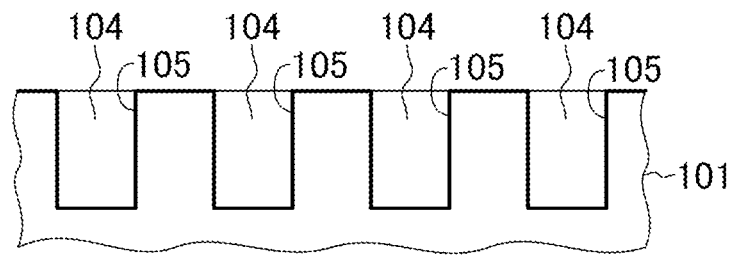
FIG. 1D is a sectional view showing a state of the standard sample in a midway step so as to explain the manufacturing method of the standard sample according to the embodiment of the present invention.
Figure 1E:
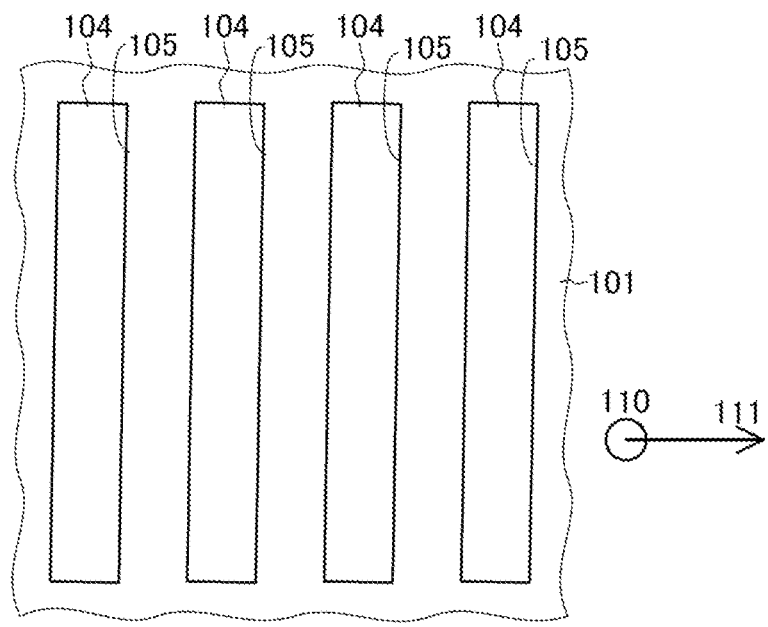
FIG. 1E is a plan view showing a state of the standard sample in a midway step so as to explain the manufacturing method of the standard sample according to the embodiment of the present invention.

Note that in the above-described etching using an alkaline solution, for example, an aqueous solution of potassium hydroxide with a concentration of 33 wt % is used as the alkaline solution, and the etching processing is performed for, for example, about 5 min. After the recesses 104 are formed in this way, the mask pattern 102 is removed. Then, as shown in FIGS. 1D and 1E, a standard sample with the recesses 104 formed in the substrate 101 is obtained. The recess 104 in this standard sample includes the side surface 105 that forms one plane perpendicular to the main surface of the substrate 101. The side surface 105 is a facet surface and is a tilting surface tilted from the (111) plane (for example, tilted by 1°).

Figure 2:
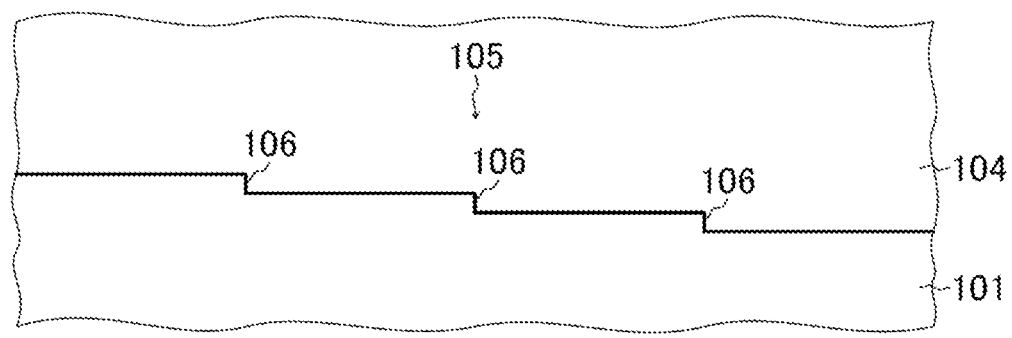
FIG. 2 is a plan view showing the structure of a part of the standard sample according to the embodiment of the present invention.

As described above, the side surface 105 formed by anisotropic etching is a facet surface tilted from the (111) plane of the single crystal silicon. For this reason, the edge portion of the recess 104, which is formed by the main surface of the substrate 101 and the side surface 105, has a level difference by a step (atomic step) 106 of the side surface 105, as shown in FIG. 2. If the side surface 105 is tilted by 1° from the (111) plane, the above-described level difference has a size of about 2 nm and periodically occurs at an interval of 120 nm. Hence, a periodical level difference structure on a nanometer order is formed in the edge portion of the recess 104, which is formed by the main surface of the substrate 101 and the side surface 105. This standard sample can be used to calibrate a scanning probe microscope such as an AFM or an electron microscope such as a critical dimension-scanning electron microscope (CD-SEM).

Note that the size of the level difference by the step 106 changes depending on the angle of tilt from the (111) plane. If the angle of tilt from the (111) plane becomes large, the level difference by the step 106 also becomes large. Hence, the angle of tilt from the (111) plane can be adapted to the desired size of the level difference.

A case where the substrate 101 is made of a single crystal of silicon has been described above. However, the present invention is not limited to this. The substrate 101 can also be made of a crystal of InP or GaAs. In this case, the side surface 105 can be a tilting surface tilted from the (111)A plane.

For example, if the substrate 101 is made of InP, an aqueous solution of bromine and hydrobromic acid or an aqueous solution of hydrochloric acid and phosphoric acid can be used as an etchant. In this wet etching, the (111)A plane of InP is difficult to etch as compared to other crystal surfaces. Hence, etching processing with crystal anisotropy as described above can be performed, and the recesses 104 can be formed using the mask pattern 102.

Also, if the substrate 101 is made of GaAs, a liquid mixture of an aqueous ammonia solution and a hydrogen peroxide solution can be used as an etchant. In this wet etching as well, the (111)A plane of GaAs is difficult to etch as compared to other crystal surfaces. Hence, etching processing with crystal anisotropy as described above can be performed, and the recesses 104 can be formed using the mask pattern 102.

As described above, according to the present invention, a recess including a side surface that is a facet surface and is a tilting surface tilted from the (111) plane is formed in the substrate whose main surface is the (110) plane. It is therefore possible to provide a standard sample capable of evaluating a line edge roughness on the order of 1 nm.

Note that the present invention is not limited to the above-described embodiment, and it is obvious that various modifications and combinations can be made by those having ordinary knowledge in the art within the technical concept of the present invention.

EXPLANATION OF THE REFERENCE NUMERALS AND SIGNS

101 . . . substrate, 102 . . . mask pattern, 103 . . . opening, 103*a* . . . side surface, 104 . . . recess, 105 . . . side surface, 106 . . . step (atomic step)

The invention claimed is:

1. A standard sample used to evaluate a microscope capable of performing observation in a nanometer size, including a scanning probe microscope, comprising:
    a substrate made of a crystal with a main surface that is a (110) plane, the substrate including a recess formed from the main surface of the substrate to an inside of the substrate,
    wherein the recess includes a side surface that forms one plane perpendicular to the main surface of the substrate, and
    the side surface is a facet surface and is a tilting surface tilted from a (111) plane.

2. The standard sample according to claim 1, wherein the substrate is made of a single crystal of silicon.

3. The standard sample according to claim 1, wherein the substrate is made of one of an InP crystal and a GaAs crystal, and the side surface is a tilting surface tilted from a (111)A plane.

4. The standard sample according to claim 1, wherein an edge portion of the recess, which is formed by the main surface of the substrate and the side surface, has a level difference by a step of the side surface.

5. A manufacturing method of a standard sample used to evaluate a microscope capable of performing observation in a nanometer size, including a scanning probe microscope, comprising:
    a first step of forming a mask pattern including an opening with a linear portion in a planar view on a substrate made of a crystal with a main surface that is a (110) plane; and
    a second step of etching the substrate by etching processing with crystal anisotropy using the mask pattern as a mask, thereby forming a recess formed from the main surface of the substrate to an inside of the substrate,
    wherein the recess includes a side surface that forms one plane perpendicular to the main surface of the substrate, and
    the side surface is a facet surface and is a tilting surface tilted from a (111) plane.

6. The manufacturing method of the standard sample according to claim 5, wherein the substrate is made of a single crystal of silicon.

7. The manufacturing method of the standard sample according to claim 5, wherein the substrate is made of one of an InP crystal and a GaAs crystal, and the side surface is a tilting surface tilted from a (111)A plane.

8. The manufacturing method of the standard sample according to claim 5, wherein an edge portion of the recess, which is formed by the main surface of the substrate and the side surface, has a level difference by a step of the side surface.

9. The standard sample according to claim 2, wherein an edge portion of the recess, which is formed by the main surface of the substrate and the side surface, has a level difference by a step of the side surface.

10. The standard sample according to claim 3, wherein an edge portion of the recess, which is formed by the main surface of the substrate and the side surface, has a level difference by a step of the side surface.

11. The manufacturing method of the standard sample according to claim 6, wherein an edge portion of the recess, which is formed by the main surface of the substrate and the side surface, has a level difference by a step of the side surface.

12. The manufacturing method of the standard sample according to claim 7, wherein an edge portion of the recess, which is formed by the main surface of the substrate and the side surface, has a level difference by a step of the side surface.

* * * * *